United States Patent [19]
Kim

[11] Patent Number: 6,104,318
[45] Date of Patent: Aug. 15, 2000

[54] METHOD FOR ENTERING A SPECIAL MODE OF AN ELECTRIC DEVICE

[75] Inventor: In-soo Kim, Seoul, Rep. of Korea

[73] Assignee: Samsung Electronics Co., Ltd., Rep. of Korea

[21] Appl. No.: 09/017,353

[22] Filed: Feb. 2, 1998

[30] Foreign Application Priority Data

Feb. 3, 1997 [KR] Rep. of Korea ......................... 97-3243

[51] Int. Cl.[7] ........................... H03K 17/94; H03M 11/00
[52] U.S. Cl. ................................ 341/22; 341/24; 341/25; 341/182
[58] Field of Search ............................... 341/22–29, 176, 341/178, 182

[56] References Cited

U.S. PATENT DOCUMENTS

| | | | |
|---|---|---|---|
| 4,357,849 | 11/1982 | Ezawa et al. | 341/26 |
| 4,408,191 | 10/1983 | Fowler, LII | 341/24 |
| 4,680,572 | 7/1987 | Meguire et al. | 341/24 |
| 5,774,051 | 6/1998 | Kostusiak | 340/539 |

*Primary Examiner*—Donnie L. Crosland
*Attorney, Agent, or Firm*—Dilworth & Barrese

[57] ABSTRACT

A method for entering a special mode of an electric device in which the special mode such as a test mode exists. According to the method, at least two coded keys are continuously inputted. From an initial key input, the coded keys are inputted in respectively predetermined amounts of time to enter the special mode. The special mode is not entered when: (1) only one of the coded keys is inputted; (2) the continuously inputted keys are not inputted in the respectively predetermined times; or (3) a combination of the continuously inputted keys is not the same with a combination of predetermined keys.

12 Claims, 5 Drawing Sheets

TV screen  Test mode

METHOD FOR ENTERING A SPECIAL MODE OF AN ELECTRIC DEVICE

BACKGROUND OF THE INVENTION

1. Field of the Invention

The present invention relates to a method for entering an existing special mode of an electric device, more particularly, it relates to a method for entering a special mode of an electric device, such as a test mode that is not known to the user, by combining function keys without any codes of a special transmitter, and for preventing the accidental entering of the test mode due to noise when the user selects a function while they are using the electric device.

2. Description of the Related Art

Typically, electric devices include special modes, such as a test mode that users generally do not know. The special mode is also known as a manufacturer adjusting mode.

In fabricating the electric devices, operators enter the respective test mode using a special transmitter and codes thereof, to check and adjust the electric devices before sending out. When the electric devices are damaged or operation failure occurs after sending out, the test mode needs to be entered again. The service technician must then try to enter the test mode or other special modes to check and repair the electric device. At this time, the special transmitter and codes thereof are required again.

However, for example, in order for a user to select a function of a TV while they are watching the TV, they send codes corresponding to the desired function through a transmitter, such as a remote controller, that has been provided with the purchase of the TV. At this time, the codes may be sent together with noise. When the noise is provided together with the codes through the remote controller, the TV may be occasionally and mistakenly set in a test mode.

In other words, special codes corresponding to a test mode are inputted into a receiver of an electric device, such as a TV receiver, through a special transmitter that has not been provided to the user with the purchase of the TV. Then, a microprocessor in the TV reads the special codes and enters the test mode. According to the test mode, the microprocessor checks and adjusts functions of the TV and displays the results of the test mode on a screen of the TV.

The conventional method for entering the test mode suffers from several disadvantages. First, the service technician should have the special transmitter for entering the test mode when he tries to test the electric device. In addition, when noise is transmitted together with the function codes through the user's remote controller, the electric device may be mistakenly set in the test mode.

SUMMARY OF THE INVENTION

It is therefore an object of the present invention to provide a method for entering a special mode of an electric device including a user transmitter, such as a remote controller, by successively combining more than two function keys of the user provided transmitter without requiring a special additional transmitter.

It is another object of the present invention to prevent the possibility of mistakenly entering a test mode of an electric device due to noise transmitted together with function codes of the user provided transmitter.

According to an aspect of the present invention, at least two coded keys of the user provided remote transmitter are continuously inputted. The coded keys input after the initial coded key are continuously inputted within respectively predetermined amounts of time, such that a desired special mode is entered. At this time, if (1) only one key of the coded keys is inputted, (2) the continuously inputted keys are not inputted within the respectively predetermined amounts of time, or (3) a combination of the continuously inputted keys is different from a predetermined combination of keys, it is impossible to enter the special mode.

When at least two coded keys are inputted, it is determined whether time intervals between the inputted keys are within the respectively predetermined amounts of time. If it is determined that the established time intervals between the inputted keys are within the respectively predetermined amounts of time, a determination is made as to whether or not to enter a special mode by comparing the combination of the inputted keys with a predetermined combination of keys. Selectively, the special mode is entered only when the combination of the continuously inputted keys is the same with the combination of the predetermined keys.

Preferably, if only one key is inputted, the entering of the special mode is prevented without requiring the comparison of the combination of input keys with the predetermined combination.

Similarly, when the coded keys are not inputted within the respectively predetermined amounts of time, the entering of the special mode is prevented without requiring the combination comparison step.

DETAILED DESCRIPTION OF PREFERRED EMBODIMENTS

A preferred embodiment of a method for entering a special mode of an electric device according to the present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
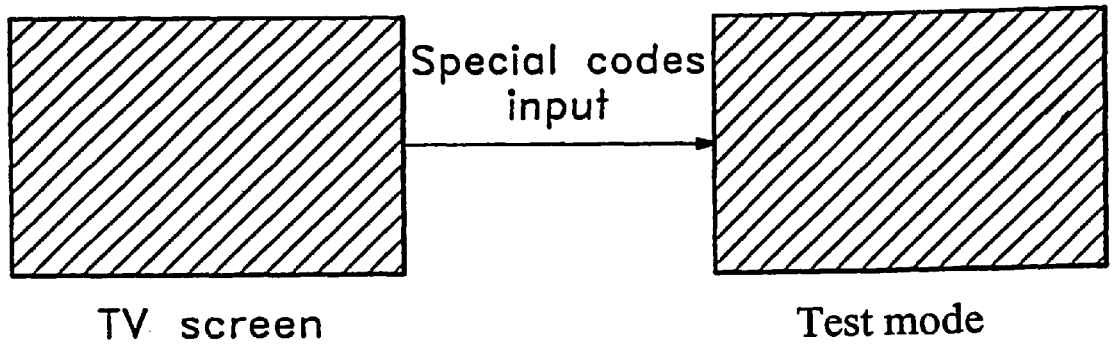
FIG. 1 is a schematic block diagram of entering a special mode in a typical electric device.
Figure 2:
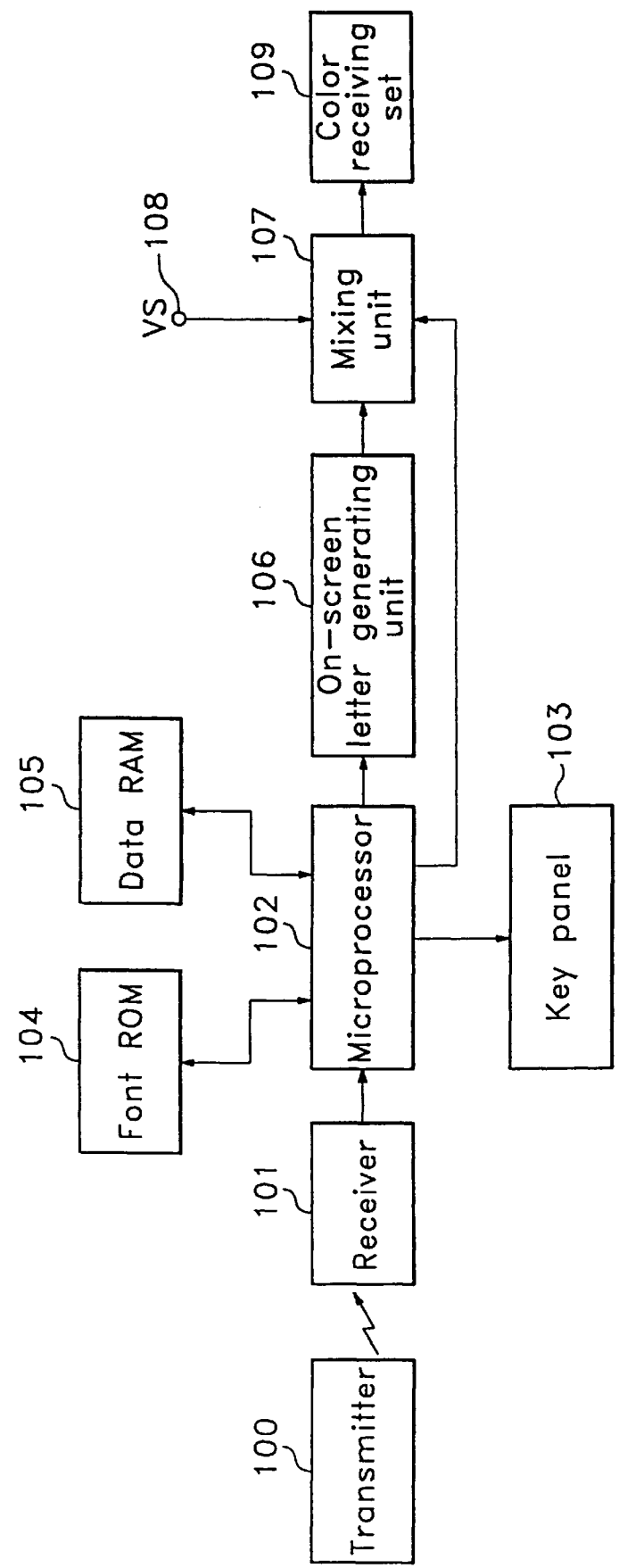
FIG. 2 is a schematic block diagram an apparatus for entering a special mode of an electric device according to an embodiment of the present invention.

FIG. 2 is a block diagram of an apparatus for entering a special mode of an electric device according to the present invention. The apparatus for entering a special mode includes a key panel 103 including number keys, volume keys, a power key and other various keys. A transmitter 100 transmits predetermined coded optical signals, and receiver 101 receives and encodes the optical signals from transmitter 100. Microprocessor 102 performs several functions such as, (1) receiving coded data inputted from key panel 103 and receiver 101; (2) saving the data in a data RAM 105; (3) reading the saved data; and (4) controlling the entering of a special mode. A font ROM 104 saves font data corresponding to letters and supplies microprocessor 102 with the saved font data. An on-screen letter generating unit 106 forms the font data inputted through microprocessor 104 into on-screen letter signals. Mixing unit 107 switches and outputs the on-screen letter signals generated in on-screen letter generating unit 106 and screen image signals inputted through an image input terminal 108, respectively, according to control signals of microprocessor 102. A color receiving set 109 displays the on-screen letter signals and the screen image signals switched and inputted from mixing unit 107.

Figure 3A:
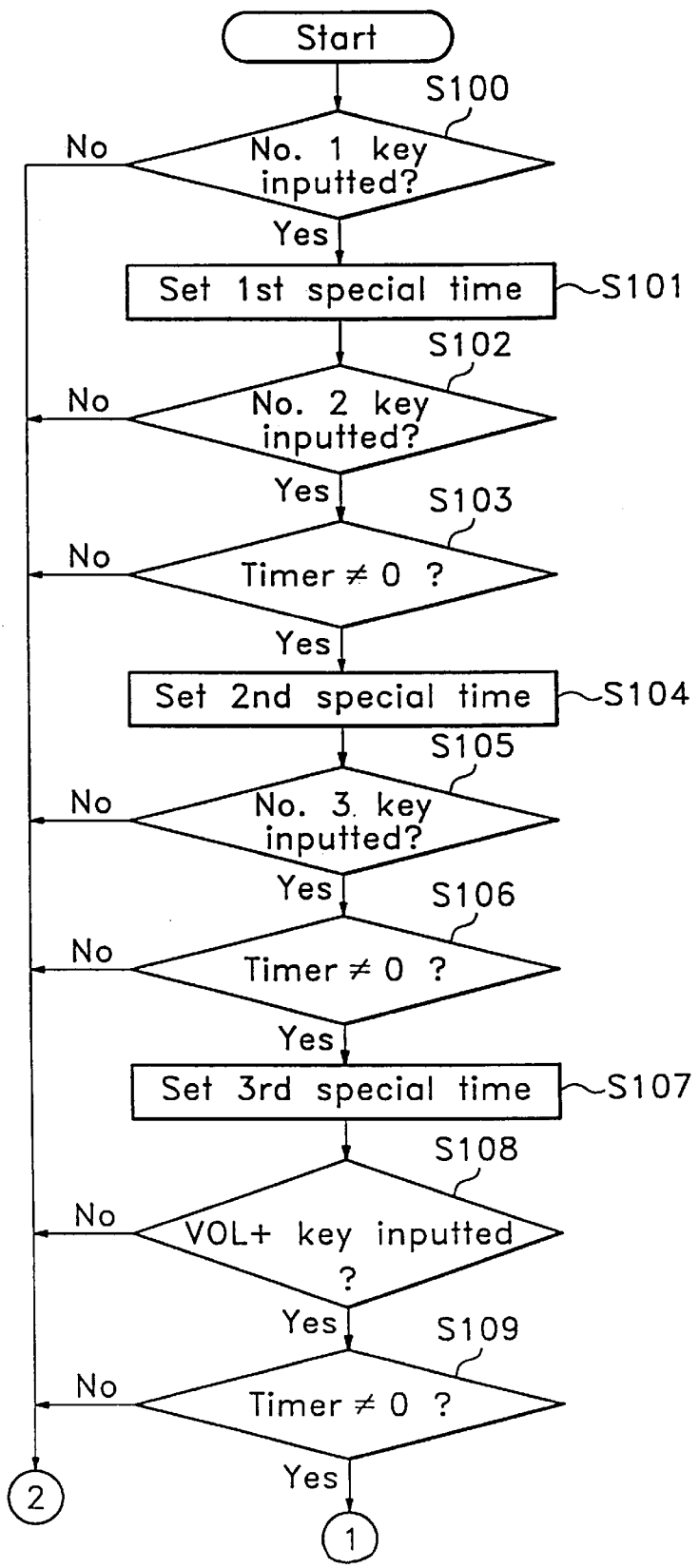
FIGS. 3A and 3B show a flowchart of the method for entering a special mode using the apparatus of FIG. 2.
Figure 3B:
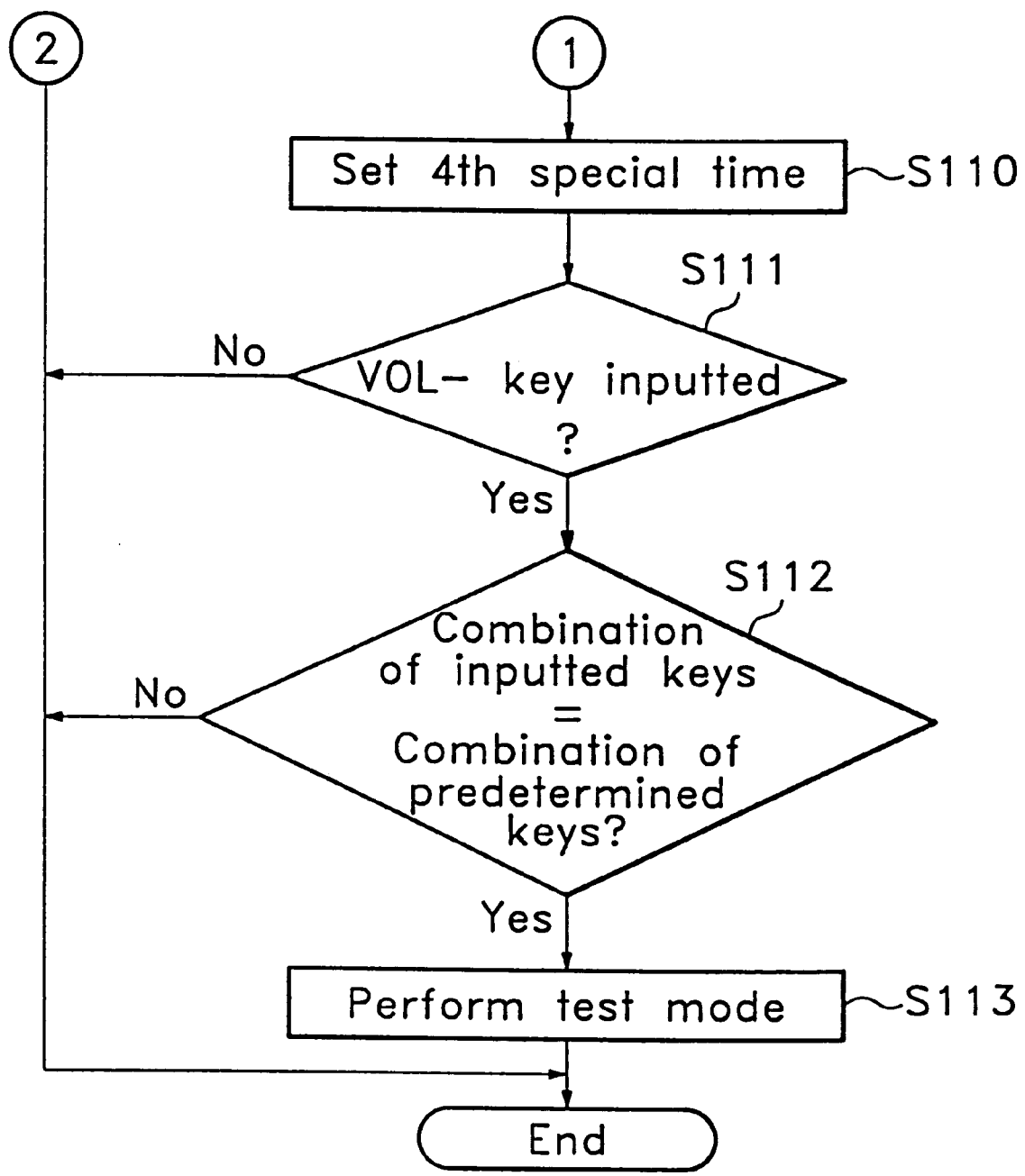

FIGS. 3A and 3B show a flowchart of the method for entering a special mode according to the present invention using the apparatus for entering a special mode shown in FIG. 2. In the method, two or more coded keys (i.e., at least two) are continuously input within respective predetermined amounts of time, at predetermined time intervals in an electric device that is equipped with a special mode such as a test mode and function keys. If the function keys are input within the predetermined amounts of time at the predetermined time intervals, the combination of the continuously input keys is compared with a combination of predetermined keys. According to the comparison, it is determined whether or not to enter the special mode.

Figure 4:
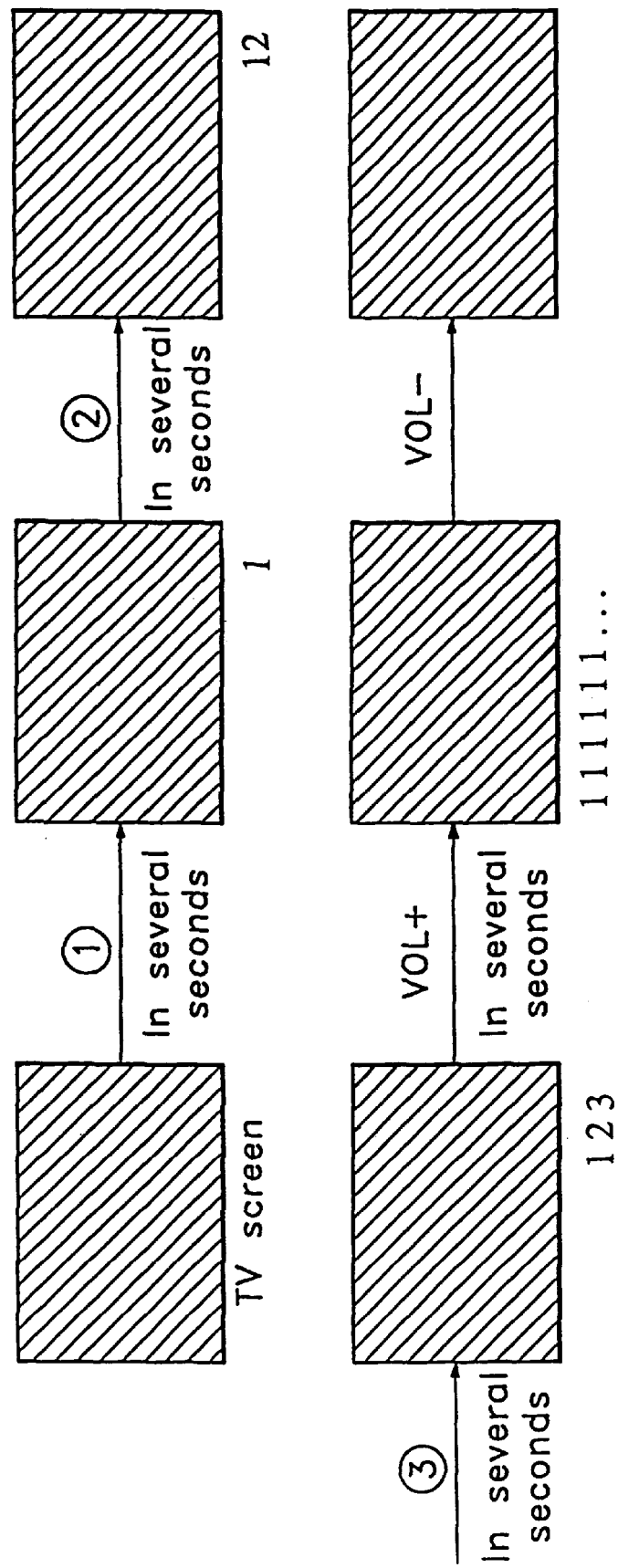
FIG. 4 is a schematic block diagram of the entering of the special mode as performed by the method of FIG. 3.

With reference to FIGS. 2 through 4, a preferred embodiment of the present invention will be described. The apparatus for entering a special mode of an electric device shown in FIG. 2 will be described by way of an example of an apparatus for entering a special mode of a TV according to the present invention.

In addition, the method for entering the special mode in the TV will be described based on an assumption that if number keys 1, 2 and 3, and the volume increasing and decreasing keys VOL+ and VOL– are continuously pressed in respectively predetermined amounts of time, a test mode that the manufacturer uses for checking and adjusting the TV during fabrication is entered.

Referring to FIGS. 3A and 3B, at step S100, if one of the number keys, for example a number 1 key, is pressed through a user transmitter such as a remote controller, a coded optical signal corresponding to the number 1 key is transmitted to receiver 101 of the TV. The receiver 101 receives and encodes the coded optical signal transmitted from the user transmitter 100, and provides microprocessor 102 with the coded key data.

Microprocessor 102 saves the coded data inputted from receiver 101 in a data RAM 105, and reads font data corresponding to the number 1 from a font ROM 104. Then, microprocessor 102 displays the read font data on a right upper portion of a screen of a color receiving set 109, as shown in FIG. 4, through on-screen letter generating unit 106 and mixing unit 107. Thereafter, microprocessor 102 establishes and sets a first special time by means of a timer thereof (step S101).

At step S102, a determination is made as to whether a number 2 key is encoded and inputted through user transmitter 100 and receiver 101. If it is determined the number 2 key is inputted, it is displayed on the right upper portion of the screen of the color receiving set 109 as shown in FIG. 4. Coded data corresponding to the number 2 key is saved in data RAM 105. At the same time, a determination is made, at step S103, as to whether or not the number 2 key is pressed within the first special time set at step S101.

If it is determined that the number 2 key is inputted within the first special time interval, a second special time interval is set by means of the timer at step S104. Then, it is prepared to receive the following key, (i.e., a number 3 key).

Thereafter, at step S105, it is determined whether or not the number key 3 is inputted. If it is determined that the number 3 key has been inputted, it is displayed on the right upper portion of the screen of color receiver 109 as shown in FIG. 4. At step S106, coded data corresponding to the number key 3 is saved in the data RAM 105, while at the same time, a determination is made as to whether or not the number 3 key is inputted within the second special time set at step S104.

At step S107, if it is determined that the number 3 key is inputted within the second special time interval, (e.g., in several seconds), a third special time interval is set to prepare to receive the following key.

Thereafter, if the volume increasing and decreasing keys VOL+ and VOL–, respectively, are inputted at predetermined time intervals at steps S108 through S110, microprocessor 102 saves them in the data RAM 105 and displays the increase and the decrease in the volume on a lower portion of the screen of the color receiving set 109, as shown in FIG. 4, through the on-screen letter generating unit 106 and the mixing unit 107.

Once all predetermined keys, i.e. the number 1,2 and 3 keys, and the volume increasing and decreasing keys VOL+ and VOL– are continuously inputted within respectively predetermined amounts of time, microprocessor 102 combines the data of the function keys saved in data RAM 105. Thereafter, microprocessor 102 compares the combination of the inputted keys with a combination of predetermined keys at step S112.

If it is determined that the combination of the inputted keys is the same as the to combination of predetermined keys at the comparing step S112, a letter notice, TEST MODE, is displayed on the screen and the test mode is performed at step S113.

In the event that (1) any of the predetermined keys is not inputted, (2) the keys are inputted not within the respectively predetermined amounts of time, or (3) the combination of the inputted keys is different from the combination of predetermined keys, the entering of the test mode is prevented.

It has been described only with an embodiment of entering a special mode by combining continuously inputted function keys of a user transmitter 100. It is apparent, however, that the key panel 103 of the electric device can also be used in the same manner as user transmitter 100, such as a remote controller, without any degradation of the effect because function keys of the key panel have a similar arrangement compared with user transmitter 100.

In addition, the present invention has been described through an exemplary embodiment of entering a special mode by combining five function keys, i.e., the number 1, 2 and 3 keys, and volume increasing and decreasing keys VOL+ and VOL–. It is also apparent, however, that at least two keys can achieve the same effect as the five keys. Furthermore, the method is not limited to TV sets. The method can be applied to any electric devices having a transmitter or a key panel, such as, for example, a VCR, an audio instrument and the like.

According to the aforementioned embodiment, it is possible to enter a special mode such as a test mode by setting at least two keys of a user transmitter 100 or a key panel 103 without using a special transmitter for entering the test mode.

Therefore, it is possible to enter a special mode of an electric device by combining keys provided to the device without requiring codes of a special transmitter. It is also possible to prevent a user from mistakenly entering the special mode in the event that noise is transmitted to the electric device together with codes of the user transmitter.

The present invention is not restricted to the above embodiments, and it is clearly understood that many variations may be made within the scope and spirit of the present invention by anyone skilled in the art.

What I claim is:

1. A method for entering a diagnostic mode of an electric device comprising the steps of:

continuously inputting at least two coded entry verification keys including a first and second entry verification key, within respective predetermined amounts of time from an initial key input wherein a second predetermined entry time for receiving said second verification key is set upon receiving said first entry verification key within a first predetermined entry time.

2. The method for entering a special mode of an electric device according to claim 1, wherein the special mode is not entered when only one key of said at least two coded keys is inputted.

3. The method for entering a special mode of an electric device according to claim 1, wherein the special mode is not entered when the coded keys are not continuously inputted in said respectively predetermined amounts of time.

4. The method for entering a special mode of an electric device according to claim 1, wherein the special mode is entered only when a combination of said continuously inputted keys is the same as a combination of predetermined keys.

5. The method for entering a special mode of an electric device according to claim 1, wherein the special mode is a test mode.

6. A method for entering a diagnostic mode of an electric device, comprising the steps of:

inputting at least two coded entry verification keys including a first and second entry verification key;

determining whether time intervals between said inputted keys are within predetermined amounts of time, wherein a second predetermined time for entering a second entry verification key is set upon receiving said first entry verification key within a first predetermined time;

comparing a combination of said inputted keys with a combination of predetermined keys when said time intervals are within said predetermined amounts of time; and determining whether to enter said diagnostic mode in response to said step of comparing.

7. The method for entering a special mode of an electric device according to claim 6, wherein said special mode is entered only when said combination of said continuously inputted keys is the same as said combination of predetermined keys.

8. The method for entering a special mode of an electric device according to claim 6, wherein said special mode can only be entered after said comparing step has been performed.

9. A method for entering a diagnostic mode of an electric device comprising the steps of:

establishing at least two time intervals for inputting at least two input key commands, said at least two input key commands forming a combination of input key commands;

comparing the at least two time intervals with respective predetermined time intervals;

comparing the combination of input key commands with a predetermined combination of key commands when said at least two time intervals are within the respective predetermined time intervals; and entering the diagnostic mode of the electric device when said combination of input key commands is the same as the predetermined combination of key commands.

10. The method according to claim 9, wherein the special mode is not entered when said at least one time interval cannot be established.

11. The method according to claim 9, wherein the special mode is not entered when said at least one time intervals are not within said respective predetermined time intervals.

12. The method according to claim 9, wherein the special mode is not entered when said combination of input key commands is not the same as the predetermined combination of key commands.

* * * * *